(12) United States Patent
Seo

(10) Patent No.: US 12,144,131 B2
(45) Date of Patent: Nov. 12, 2024

(54) DISPLAY DEVICE

(71) Applicant: Samsung Display Co., LTD., Yongin-si (KR)

(72) Inventor: Tae An Seo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 193 days.

(21) Appl. No.: 17/765,954

(22) PCT Filed: Dec. 26, 2019

(86) PCT No.: PCT/KR2019/018482
§ 371 (c)(1),
(2) Date: Apr. 1, 2022

(87) PCT Pub. No.: WO2021/066256
PCT Pub. Date: Apr. 8, 2021

(65) Prior Publication Data
US 2022/0346252 A1     Oct. 27, 2022

(30) Foreign Application Priority Data

Oct. 2, 2019   (KR) .......................... 10-2019-0122330

(51) Int. Cl.
*H05K 5/02*        (2006.01)
*H05K 5/00*        (2006.01)

(52) U.S. Cl.
CPC ......... *H05K 5/0217* (2013.01); *H05K 5/0018* (2022.08); *H05K 5/0021* (2013.01)

(58) Field of Classification Search
CPC .. H05K 5/0217; H05K 5/0018; H05K 5/0021; H05K 2201/10128;
(Continued)

(56) References Cited

U.S. PATENT DOCUMENTS 8,711,566 B2    4/2014   O'Brien
9,195,272 B2    11/2015  O'Brien
(Continued)

FOREIGN PATENT DOCUMENTS

CN     105489628 A    4/2016
CN     208014279 U    10/2018
(Continued)

OTHER PUBLICATIONS

Chinese Office Action—Chinese Application No. CN 201980100964.4 dated Dec. 29, 2023, citing references listed within.
(Continued)

*Primary Examiner* — Michael A Matey
(74) *Attorney, Agent, or Firm* — CANTOR COLBURN LLP

(57) ABSTRACT

A display device includes: a first display unit; a second display unit; a first support part under the first display unit; a second support part under the second display unit; a first housing which accommodates the first support part and the first display unit; a second housing into or from which the second support part and the second display unit are inserted or withdrawn; and a guide groove defined in the second housing and which guides the second support part during the inserting or withdrawing. The inserting or withdrawing is performed along a first direction, the second support part includes support bars extending along a second direction, each support bar includes a first part not inserted into the guide groove and a second part inserted into the guide groove, and a width of the second part is smaller than a width of the first part in the first direction.

20 Claims, 17 Drawing Sheets

(58) Field of Classification Search
CPC . H05K 7/20954; G06F 1/1624; G06F 1/1637; G06F 1/1626; G06F 1/1675; G06F 1/1601; G06F 1/1647; G06F 1/1679; G06F 3/147; G06F 1/16; G06F 2203/04803; H04M 1/0235; H04M 2250/16; G02F 1/133308

See application file for complete search history.

(56) References Cited

U.S. PATENT DOCUMENTS

| | | | |
|---|---|---|---|
| 10,416,796 B2* | 9/2019 | Song | H10K 50/84 |
| 12,019,474 B2* | 6/2024 | Song | G06F 1/1624 |
| 2013/0058063 A1* | 3/2013 | O'Brien | G06F 1/1624 |
| | | | 361/807 |
| 2014/0194165 A1* | 7/2014 | Hwang | G06F 3/147 |
| | | | 455/566 |
| 2016/0366772 A1* | 12/2016 | Choi | G06F 1/1675 |
| 2017/0364119 A1* | 12/2017 | Lee | G06F 1/1652 |
| 2018/0014417 A1* | 1/2018 | Seo | H05K 7/20954 |
| 2018/0077808 A1 | 3/2018 | Seo et al. | |
| 2018/0102072 A1* | 4/2018 | Lee | G06F 1/1641 |
| 2018/0103550 A1* | 4/2018 | Seo | G06F 1/1601 |
| 2018/0103552 A1 | 4/2018 | Seo et al. | |
| 2019/0310686 A1* | 10/2019 | Lee | G06F 1/1652 |
| 2019/0384438 A1* | 12/2019 | Park | G06F 3/0482 |
| 2020/0313112 A1* | 10/2020 | Lee | H10K 59/00 |
| 2020/0314225 A1* | 10/2020 | Ahn | G06F 1/1652 |
| 2020/0315036 A1* | 10/2020 | Ahn | H05K 5/0017 |
| 2020/0363841 A1* | 11/2020 | Kim | G06F 1/1626 |
| 2022/0167512 A1* | 5/2022 | Ahn | G06F 1/1652 |
| 2022/0253103 A1* | 8/2022 | Choi | G09F 9/301 |
| 2022/0263932 A1* | 8/2022 | Jo | G06F 1/1681 |
| 2023/0350462 A1* | 11/2023 | Jung | H04M 1/0268 |

FOREIGN PATENT DOCUMENTS

| | | |
|---|---|---|
| CN | 107818735 B | 9/2021 |
| KR | 20140059274 A | 5/2014 |
| KR | 1020160097033 A | 8/2016 |
| KR | 1020160141255 A | 12/2016 |
| KR | 1020160148116 A | 12/2016 |
| KR | 101784880 B1 | 10/2017 |
| KR | 1020180040181 A | 4/2018 |
| KR | 1020190014228 A | 2/2019 |
| KR | 1020190062855 | 6/2019 |
| WO | 2018186631 A1 | 10/2018 |

OTHER PUBLICATIONS

International Search Report mailedJul. 1, 2020 for PCT/KR2019/018482.

* cited by examiner

DISPLAY DEVICE

TECHNICAL FIELD

The present disclosure relates to a display device, and more particularly, to a display device including a flexible display module that is foldable and slidable.

BACKGROUND ART

A display module provides information to a user by displaying various images on a display screen. Generally, the display module displays information within an assigned screen. A flexible display module including a flexible display panel that can be bent has been developed. Unlike a flat panel display device, a flexible display device can be folded, rolled, or bent like paper. Since the flexible display device, which can be variously changed in shape, can be carried regardless of the size of the existing screen, user convenience is improved.

DISCLOSURE

Technical Problem

Aspects of the present disclosure provide a display device which is easier to slide.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

Technical Solution

According to an aspect of the present disclosure, there is provided a display device including: a display module which includes a first display unit and a second display unit; a support member which includes a first support part overlapping the first display unit and a second support part overlapping the second display unit; a first housing which accommodates the first support part and the first display unit; a second housing which accommodates the second support part and the second display unit and into or from which the second support part is inserted or withdrawn; and a guide groove which is defined inside the second housing and guides the second display unit when the second support part is inserted into or withdrawn from the second housing. The inserting or withdrawing of the second support part is performed along a first direction, the second support part includes a plurality of joints which extend along a second direction intersecting the first direction and are spaced apart from each other, each of the joints includes a first part which does not overlap the second housing and a second part which overlaps the second housing, and a width of the second part in the first direction is smaller than a width of the first part in the first direction.

The second part may be provided in plural, and at least two second parts among the plurality of second parts may be connected to one end of the first part.

The at least two second parts may be spaced apart from each other along the first direction.

The at least two second parts may be spaced apart from each other along a thickness direction of the display module.

The first support part may be monolithic.

A side area of the second part may be smaller than a side area of the first part.

A perimeter of an upper surface may be greater than a perimeter of a lower surface in a side shape of the first part, and a perimeter of an upper surface may be greater than a perimeter of a lower surface in a side shape of the second part.

The second housing may be inserted in the first housing in a first operating mode, and the first housing and the second housing may be separated from each other in a second operating mode.

The first display unit may be exposed to an outside both in the first operating mode and the second operating mode, and the second display unit may be accommodated in the second housing in the first operating mode and may be exposed to the outside from the second housing in the second operating mode.

The guide member may bend the second display unit inserted into the second housing so that the second display unit faces the first display unit.

The guide member may roll the second display unit inserted into the second housing so that the second display unit is wound around the guide member.

In the first operating mode, the second housing may be disposed between the first housing and the display module and coupled to the first housing.

The second housing may include a first part disposed between the first housing and the display module and a second part protruding further than the first part in the thickness direction of the display module, and the second part may be disposed on a side surface of the first housing.

The guide member may be a rotor.

According to another aspect of the present disclosure, there is provided a display device including: a flexible display module which includes a first display unit, a second display unit, and a third display unit; a support member which includes a first support part overlapping the first display unit, a second support part overlapping the second display unit, and a third support part overlapping the third display unit; a first housing into or from which the second support part is inserted or withdrawn; a second housing into or from which the third support part is inserted or withdrawn; a first guide member which is coupled to the first housing and guides the second display unit when the second support part is inserted into or withdrawn from the first housing; and a second guide member which is coupled to the second housing and guides the third display unit when the third support part is inserted into or withdrawn from the second housing. The inserting or withdrawing of the second support part and the third support part is performed along a first direction, the second support part includes a plurality of joints which extend along a second direction intersecting the first direction and are spaced apart from each other, each of the joints includes a first part which does not overlap an upper part of the first housing and a second part which overlaps the upper part of the first housing, and a width of the second part in the first direction is smaller than a width of the first part in the first direction.

The third support part includes a plurality of joints which extend along the second direction and are spaced apart from each other, each of the joints of the third support part includes a third joint part which does not overlap an upper part of the second housing and a fourth joint part which overlaps the upper part of the second housing, and a width of the fourth joint part in the first direction is smaller than a width of the third joint part in the first direction.

The second part may be provided in plural, and at least two second parts among the plurality of second parts may be connected to one first part.

The at least two second parts may be spaced apart from each other along the first direction.

The at least two second parts may be spaced apart from each other along a thickness direction of the display module.

A side area of the second part may be smaller than a side area of the first part.

Advantageous Effects

According to embodiments of the present disclosure, a display device which is easier to slide can be provided.

However, the effects of the present disclosure are not limited to the aforementioned effects, and various other effects are included in the present specification.

MODE FOR INVENTION

A display device is a device that displays a moving image or a still image. The display device may be used to implement display screens of portable electronic devices such as mobile phones, smartphones, tablet personal computers ("PCs", smart watches, watch phones, mobile communication terminals, electronic notebooks, electronic hooks, portable multimedia players ("PMPs"), navigation devices and ultra-mobile PCs ("UMPCs") as well as various products such as televisions, notebook computers, monitors, billboards and the Internet of things ("IoT").

Hereinafter, embodiments of the present disclosure will be described with reference to the drawings.

Figure 1:
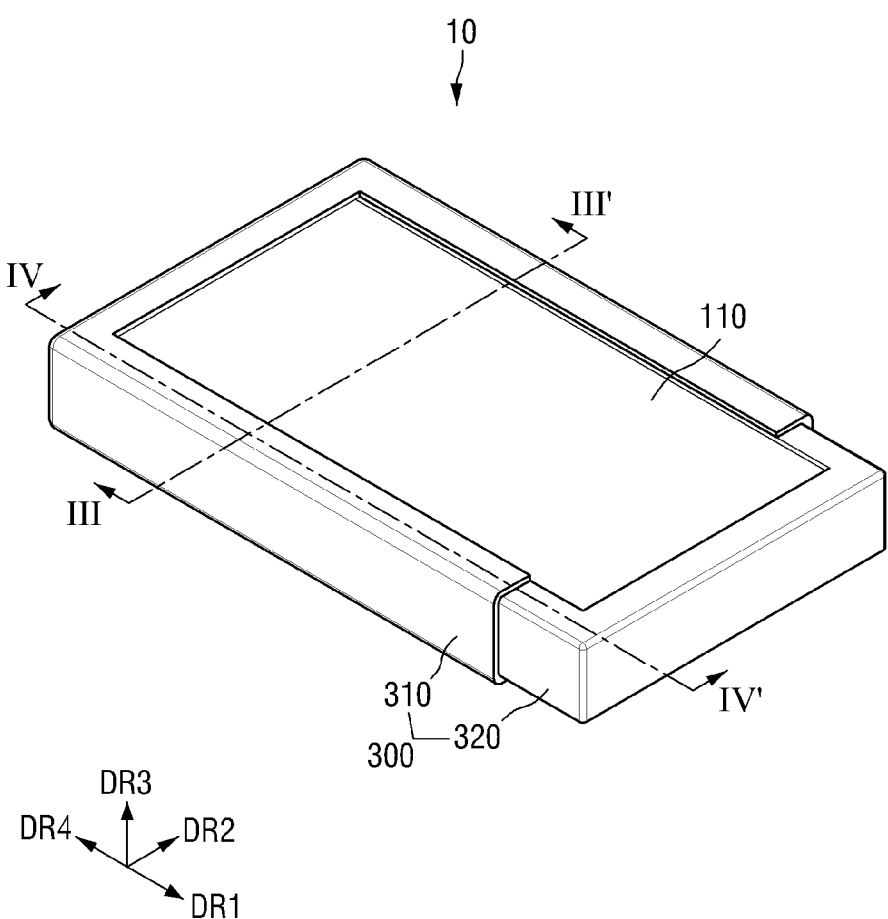
FIG. 1 is a perspective view of a display device according to an embodiment before a sliding operation.
Figure 2:
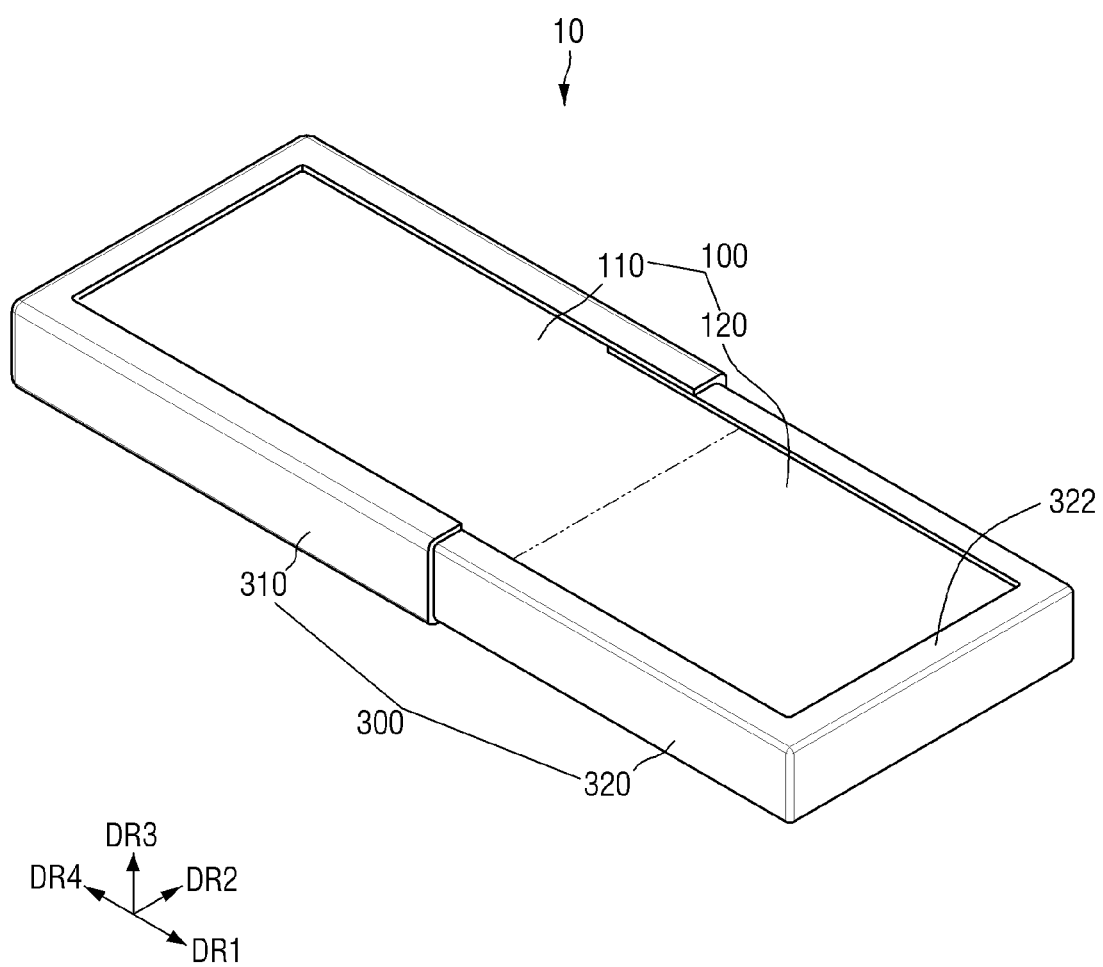
FIG. 2 is a perspective view of the display device according to the embodiment after a sliding operation.
Figure 3:
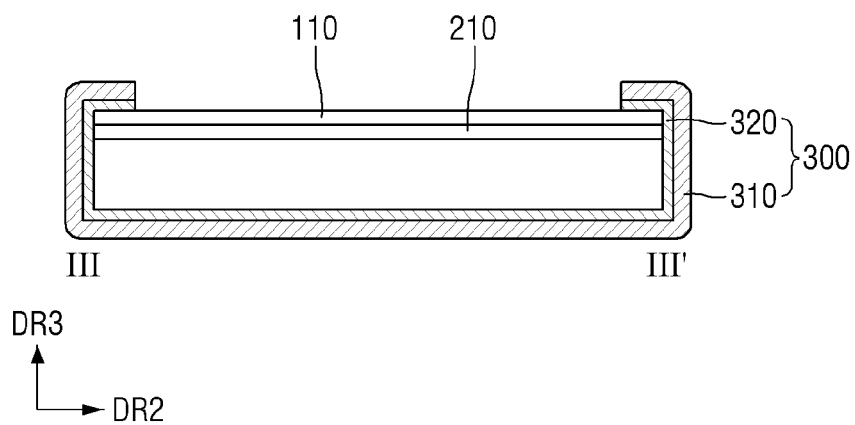
FIG. 3 is a schematic cross-sectional view taken along line III-III' of FIG. 1.
Figure 4:
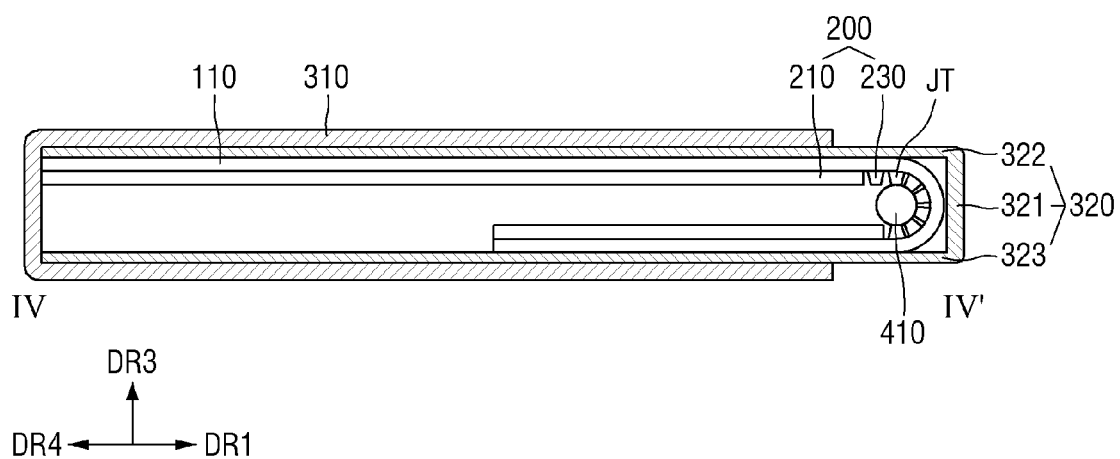
FIG. 4 is a schematic cross-sectional view taken along line IV-IV' of FIG. 1.

FIG. 1 is a perspective view of a display device according to an embodiment before a sliding operation. FIG. 2 is a perspective view of the display device according to the embodiment after a sliding operation. FIG. 3 is a schematic cross-sectional view taken along line III-III' of FIG. 1. FIG. 4 is a schematic cross-sectional view taken along line IV-IV' of FIG. 1.

FIG. 1 illustrates the display device 10 in a closed mode (hereinafter, referred to as a "first operating mode"). FIG. 2 illustrates the display device 10 in an expanded mode (hereinafter, referred to as a "second operating mode").

As illustrated in FIGS. 1 and 2, the display device 10 may include a display module 100, a support member 200, and housings 300. The display device 10 may further include a guide member 410 (see FIG. 4) or a first guide member 410 which will be described later. The display module 100 includes a first display unit 110 and a second display unit 120.

The display module 100 may be a flexible display module. That is, the flexible display module can be folded or rolled. The display module 100 is a module or panel that displays an image in response to an input data signal, and a panel such as an organic light emitting display panel, a liquid crystal display panel, a plasma display panel, or an electrophoretic display panel may be applied. In the illustrated embodiment, an organic light emitting display panel is applied as a display module or a display panel.

The display module 100 includes a plurality of pixels. Each pixel may include a light emitting layer and a circuit layer for controlling the amount of light emitted from the light emitting layer. The circuit layer may include a display line, a display electrode, and at least one transistor. The light emitting layer may include an organic light emitting material. The light emitting layer may be sealed by an encapsulation layer. The encapsulation layer may seal the light emitting layer to prevent moisture, etc. from being introduced from the outside. The encapsulation layer may be a single or multi-layered inorganic layer or may be a stacked layer in which an inorganic layer and an organic layer are alternately stacked.

The first display unit 110 and the second display unit 120 of the display module 100 may include a plurality of pixels. The display module 100 may further include a non-display unit disposed around the first display unit 110 and the second display unit 120. The non-display unit may be an area overlapped, by the housings 300 and not visible from the outside due to the housings 300. The pixels may not be disposed in the non-display unit. However, the present disclosure is not limited thereto, and the pixels may also be disposed in a part of the non-display unit in another embodiment.

The display module 100 may further include a touch member. The touch member may be directly disposed on the encapsulation layer or may be attached to the encapsulation layer through a bonding layer or the like in the form of a touch panel. The touch member may include a plurality of touch electrodes disposed on one layer or a plurality of layers. However, the elements included in the display module 100 are not limited thereto.

The support member 200 may overlap the display module 100. The support member 200 may overlap the first and second display units 110 and 120 of the display module 100 in a thickness direction of the display module 100.

As will be described later, the support member 200 may include a first support part 210 (see FIG. 4) overlapping the first display unit 110 and a second support part 230 (see FIG. 4) overlapping the second display unit 120. The first support part 210 and the first display unit 110 may directly contact each other, and the second support part 230 and the second display unit 120 may directly contact each other. That is, the first support part 210 may be disposed under the first display unit 110, and the second support part 230 may be disposed under the second display unit 120.

The housings 300 may include a first housing 310 and a second housing 320.

The display device 10 in the first operating mode will be described with reference to FIG. 1. The first housing 310 and the second housing 320 are coupled to each other. The first housing 310 and the second housing 320 may physically directly contact each other.

The first display unit 110 may be exposed to the outside to provide image information to a user both in the first and second operating modes. The second display unit 120 may be accommodated in the second housing 320. Since the second display unit 120 is accommodated in the second housing 320 in the first operating mode, even if it includes a plurality of pixels, an image displayed in the second display unit 120 may not be visible from the outside. That is, the second display unit 120 may not provide image information to a user in the first operating mode. However, the present disclosure is not limited thereto, and the second display unit 120 may also provide image information to a user m the first operating mode.

The support member 200 may have substantially the same planar size as the display module 100. Like the display module 100, the support member 200 may be accommodated in the first housing 310 and the second housing 320 in the first operating mode. In FIGS. 1 to 4, an accommodating groove or a guide groove GG defined in an inside of a sidewall of the housings 310 and 320 extending along the first direction DR1 and in which the support member 200 and the display module 100 are accommodated or mounted is not shown. However, the housings 310 and 320 may further include an accommodating groove or a guide groove GG in which the support member 200 and edge parts of the display module 100 are accommodated or mounted (See FIG. 5).

The display device 10 in the second operating mode will be described with reference to FIG. 2. The second housing 320 may be drawn out of the first housing 310. That is, in FIG. 1, most of the second housing 320 is accommodated in the first housing 310. However, in the second operating mode according to FIG. 2, the first housing 310 may be fixed, and most of the second housing 320 may be withdrawn from the first housing 310. The first housing 310 and the second housing 320 may still be coupled to each other in the second operating mode. The second display unit 120 may be exposed to the outside by the second housing 320 moving along a first direction DR1. The second display unit 120 may include a plurality of pixels as described above and thus provide image information to a user when the display device 10 is put in the second operating mode as the second housing 320 moves along the first direction DR1. That is, the second support part 230 and the second display unit 120 may be inserted along a fourth direction DR4 or withdrawn along the first direction DR1.

The first display unit 110 is exposed to the outside in the first operating mode, and the second display unit 120 is accommodated in the second housing 320 in the first operating mode and exposed to the outside from the second housing 320 in the second operating mode.

The second support part 230 and the second display unit 120 may be inserted or withdrawn by the second housing 320. That is, the second housing 320 may insert or withdraw the second support part 230 and the second display unit 120.

The guide groove GG may be defined in the second housing 320 and may guide the second support part 230 when the second support part 230 is inserted or withdrawn. The first housing 310 may accommodate the first support part 210 and the first display unit 110, and the second housing 320 may accommodate the second support part 230 and the second display unit 120.

In the second operating mode, the area of the first display unit 110 may be 0.8 to 1.2 times the area of the second display unit 120. In this case, the area of the display module 100 exposed in the second operating mode may be about twice the area of the display module 100 exposed in the first operating mode. That is, as the first operating mode is changed to the second operating mode, the display device 10 may provide image information about twice as large to a user.

Referring to FIGS. 3 and 4, the support member 200 may further include the first support part 210 and the second support part 230 that is connected to the first support part 210 and disposed on a side of the first support part 210.

The first support part 210 may substantially overlap the first display unit 110 of the display module 100, and the second support part 230 may substantially overlap the second display unit 120 of the display module 100.

As illustrated in FIG. 3, the first display unit 110 and the first support part 210 may be mounted or accommodated in the first housing 310.

The first housing 310 may further include a protruding part disposed on the display module 100 and protruding toward the inside of the display module 100, although the present disclosure is not limited thereto. The non-display part of the display module 100 and edge parts of the first support part 210 may be covered by the protruding part of the first housing 310.

As illustrated in FIG. 4, the first housing 310 may include a sidewall located in a fourth direction DR4 (i.e., left side in FIG. 4) and extending along the second direction DR2, an upper part extending along the first direction DR1 from an upper end of the sidewall, and a lower part extending along the first direction DR1 from a lower end of the sidewall.

Like the first housing 310, the second housing 320 may include a sidewall located in the first direction DR1 (i.e., right side in FIG. 4) and extending along the second direction DR2, an upper part extending along the fourth direction DR4 from an upper end of the sidewall located in the first direction DR1, and a lower part extending along the fourth direction DR4 from a lower end of the sidewall located in the first direction DR1. The sidewall, upper part, and lower part of the second housing 320 may be referred to as a main part 321. That is, the main part 321 of the second housing 320 may include the sidewall, the upper part, and the lower part described above.

The upper part and the lower part of the second housing 320 may be disposed between the upper part and the lower part of the first housing 310.

The second housing 320 may further include a first protruding part 322 protruding in the fourth direction DR4 from the upper part and a second protruding part 323 protruding in the fourth direction DR4 from the lower part, in addition to the sidewall, the upper part, and the lower part described above. A surface of the first protruding part 322 may lie in the same plane as a surface of the upper part of the first housing 310, and a surface of the second protruding part 323 may lie in the same plane as a surface of the lower part of the first housing 310. However, the present disclosure is not limited thereto, and the first protruding part 322 and the second protruding part 323 of the second housing 320 may also lie in different planes from the upper part and the lower part of the first housing 310, respectively.

Although not illustrated, the first guide member 410 may be physically connected to the second housing 320. The first guide member 410 may be a rotor that enables the display module 100 and the support member 200 to rotate along the first guide member 410 while changing the mode between the first operating mode and the second operating mode. The first guide member 410 may be a rotor extending along a second direction DR2.

In the first operating mode, each of the display module 100 and the support member 200 may be rolled along the first guide member 410. That is, in the first operating mode, the first display unit 110 of the display module 100 may be flat, and the second display unit 120 of the display module 100 may be rolled along the first guide member 410 to lie on the sidewall of the main part 321 of the second housing 320 and also face the first display unit 110. That is, the first guide member 410 may bend the second display unit 120 inserted into the second housing 320 so that the second display unit 120 faces the first display unit 110.

Although not illustrated in the drawings, the first guide member 410 may roll the second display unit 120 inserted into the second housing 320 so that the second display unit 120 is wound around the first guide member 410.

The first support part 210 of the support member 200 may have a generally flat shape to face the first display unit 110. The second support part 230, like the second display unit 120 of the display module 100, may be rolled along the first guide member 410 to lie on the sidewall of the main part 321 of the second housing 320 and also face the first support part 210.

As illustrated in FIG. 4, the first support part 210 may not have completely the same planar size as the first display unit 110 of the display module 100 in a plan view and thus may be disposed on a part of the first display unit 110 but may not be disposed on another part. The second support part 230 may be disposed on a part of the first display unit 110 on which the first support part 210 is not disposed and on a surface of the second display unit 120.

As illustrated in FIG. 4, the second support part 230 may include a support bar JT or a joint. The support bar JT of the second support part 230 may extend along the second direction DR2 in FIGS. 1 and 2. The second support part 230 may include a plurality of support bars JT. The support bars JT may be spaced apart from each other. That is, the support bars JT may be spaced apart from each other along the first direction DR1.

Each of the support bars JT may have a trapezoidal shape in a cross-sectional view. When each of the support bars JT has a trapezoidal shape, it may have a first surface coupled to the display module 100 and a second surface facing the first surface. A length of the first surface of each support bar JT in the first direction DR1 may be greater than a length of the second surface in the first direction DR1. That is, since the length of the second surface of each support bar JT in contact with the first guide member 410 is smaller than the length of the first surface of each support bar JT in the first direction DR1, it is possible to minimize friction generated between adjacent support bars JT touching each other when the second support part 230 is guided to be unrolled by the first guide member 410 in the second operating mode of the display device 10.

In FIG. 4, the first display unit 110 of the display module 100 is illustrated to be spaced apart from the upper part of the first housing 310 by a predetermined distance in an area not overlapping the upper part of the second housing 320. However, the present disclosure is not limited thereto, and the second housing 320 may also be coupled to the first display unit 110 in the above area in another embodiment.

In addition, the second display unit 120 facing the first display unit 110 of the display module 100 is spaced apart from the lower part of the first housing 310 by a predetermined distance in an area not overlapping the upper part of the second housing 320. However, the present disclosure is not limited thereto, and the second housing 320 may also be coupled to the second display unit 120 in the above area in another embodiment.

Opposite ends of each support bar JT of the second support part 230, for example, a first end in the second direction DR2 and a second end in a direction opposite to the second direction DR2 may be accommodated by the second housing 320 (i.e., by a guide groove in the second housing 320). When the operating mode is changed from the first operating mode to the second operating mode, the support bars JT of the second support part 230 may slide through the first guide member 410. When the support bars JT of the second support part 230 slide, rotational texture a user can feel may be degraded at the first end and the second end overlapping the upper part and the lower part of the second housing 320 due to interference by the upper part and the lower part of the second housing 320. That is, when the support bars JT of the second support part 230 slide, there is a possibility that the first end and the second end of each support bar JT will have frictional resistance in an area overlapping the upper part and the lower part of the second housing 320 and also that the radius of rotation will be increased.

In addition, if the distance between the support bars JT is increased to prevent this, a pattern due to the distance between the support bars JT is likely to be seen from the outside.

Figure 5:
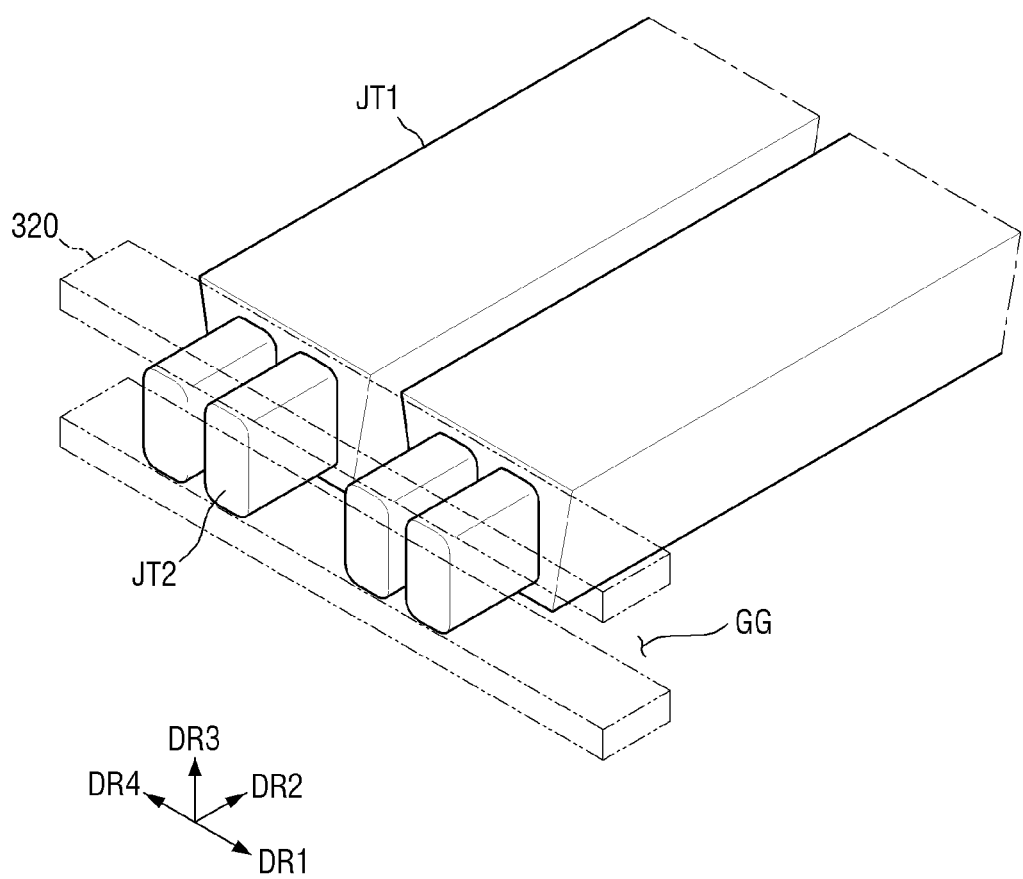
FIG. 5 is a perspective view illustrating the arrangement relationship of joints of a second support part and a second housing.
Figure 6:
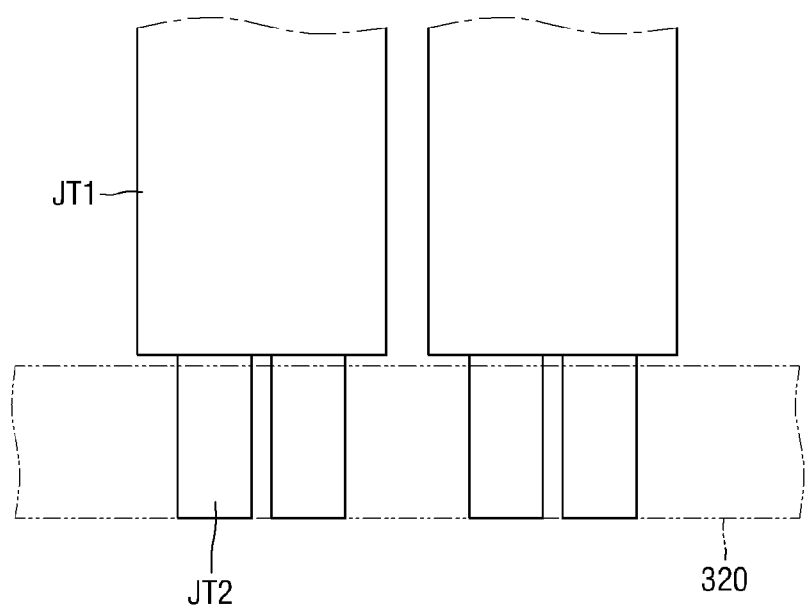
FIG. 6 is a plan view illustrating the arrangement relationship of the joints of the second support part and the second housing.
Figure 7:
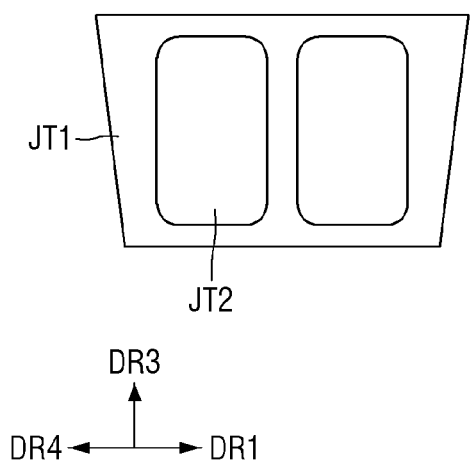
FIG. 7 is a side view illustrating the arrangement relationship of the joints of the second support part and the second housing.

FIG. 5 is a perspective view illustrating the arrangement relationship of joints of the second support part and the second housing. FIG. 6 is a plan view illustrating the arrangement relationship of the joints of the second support part and the second housing. FIG. 7 is a side view illustrating the arrangement relationship of the joints of the second support part and the second housing. In FIGS. 5 through 7, the display module and the first guide member other than the second support part and the second housing are omitted for ease of description.

Referring to FIGS. 5 through 7, each support bar JT of the second support part 230 may include a first part JT1 not overlapping the upper part of the second housing 320 and a second part JT2 physically connected to the first part JT1 and overlapping the second housing 320. The second part JT2 may overlap the upper part and the lower part of the second housing 320. From the perspective view (i.e., FIG. 5), the first part JT1 may be a part not inserted into the guide groove GG, and the second part JT2 may be a part inserted into the guide groove GG. That is, the first part JT1 may not be inserted into the guide groove GG, and the second part JT2 may be inserted into the guide groove GG.

The planar shape (i.e., shape shown in a plan view) of the first part JT1 may be, but is not limited to, a rectangular shape.

As described above, when the support bars JT of the second support part 230 slide, rotational texture may be degraded at a first end and a second end overlapping the upper part and the lower part of the second housing 320 due to interference by the upper part and the lower part of the second housing 320. That is, when the support bars JT of the second support part 230 slide, there is a possibility that the first end and the second end of each support bar JT will have frictional resistance in an area overlapping the upper part and the lower part of the second housing 320 and that the radius of rotation will be increased.

In addition, if the distance between the support bars JT is increased to prevent this, a pattern due to the distance between the support bars JT is likely to be seen from the outside.

In the display device 10 according to the embodiment, one support bar JT is reduced in size in an area overlapping the second housing 320, thereby preventing degradation of rotational texture in advance.

More specifically, referring to FIGS. 5 and 6, a planar size of the second part JT2 connected to the first part JT1 may be smaller than a planar size of the first part JT1.

A width of the second part JT2 in the first direction DR1 may be smaller than a width of the first part JT1 in the first direction DR1.

The second part JT2 may be provided in plural numbers. Although two second parts JT2 connected to one first part JT1 are illustrated in FIG. 6, the present disclosure is not limited thereto, and the number of the second parts JT2 may also be three or more. The second parts JT2 may be spaced apart from each other along the first direction DR1. As described above, the second parts JT2 spaced apart from each other may be connected to the first part JT1.

As illustrated in FIGS. 5 and 7, a side shape of each second part JT2 may be a rectangular shape with rounded corners. The rectangular shape with rounded corners may have a greater width in the thickness direction of the display module 100 than in the first direction DR1. That is, a direction in which the side shape of each second part JT2 extends may be the thickness direction of the display module 100. Since the side shape of each second part JT2 according to an embodiment has a rectangular shape with rounded corners, when the support bars JT of the second support part 230 slide, it is possible to reduce frictional resistance of one end and the other end of each support bar JT in an area overlapping the upper part and the lower part of the second housing 320 and also possible to prevent a reduction in the radius of rotation in advance.

When the second parts JT2 have a rectangular shape with rounded corners in a cross-sectional view, the side shape of each second part JT2 may include an upper surface and a lower surface substantially facing the upper surface. Here, the upper surface and the lower surface may have substantially the same length or perimeter in the first direction DR1.

In addition, although not illustrated, the display module 100 may be disposed on and under the second parts JT2 as described above. Thus, when the display device 10 slides, the display module 100 disposed on and under the second parts JT2 can be prevented from being physically damaged.

As illustrated in FIG. 7, a side area of each second part JT2 may be smaller than a side area of the first part JT1.

Hereinafter, other embodiments of the display device described above will be described. In the following embodiments, the same elements as those of the above-described embodiment are identified by the same reference characters, and thus a description thereof will be omitted or given briefly.

Figure 8:
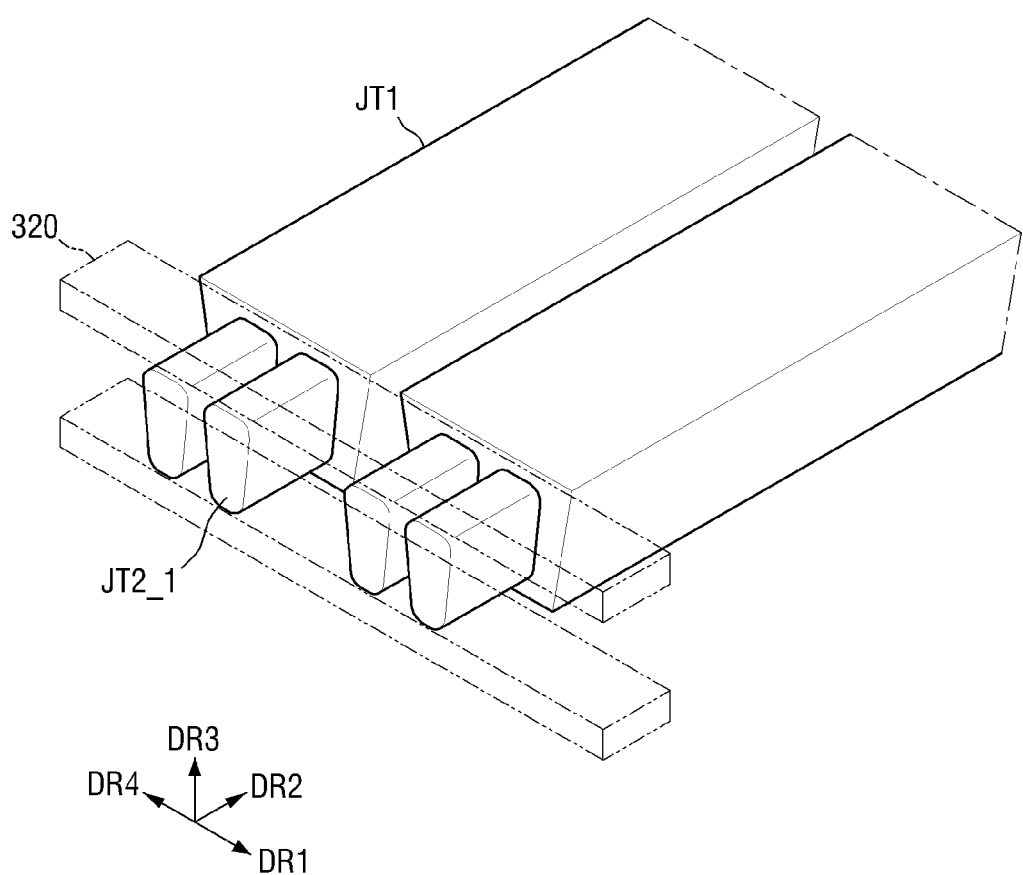
FIG. 8 is a perspective view illustrating the arrangement relationship of joints of a second support part and a second housing according to another embodiment.
Figure 9:
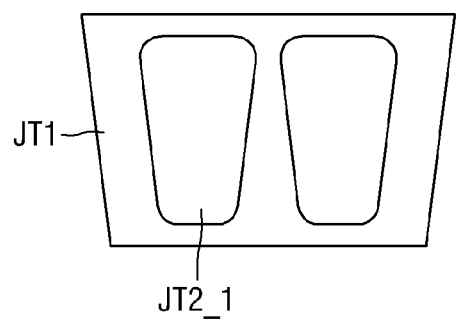
FIG. 9 is a side view illustrating the arrangement relationship of the joints of the second support part and the second housing according to another embodiment.

FIG. 8 is a perspective view illustrating the arrangement relationship of joints of a second support part and a second housing according to another embodiment. FIG. 9 is a side view illustrating the arrangement relationship of the joints of the second support part and the second housing according to another embodiment.

Referring to FIGS. 8 and 9, the current embodiment is different from that of FIGS. 5 and 7 in that a second part JT2_1 according to the current embodiment has a different shape from a second part JT2 illustrated in FIGS. 5 and 7.

More specifically, a side shape of the second part JT2_1 according to the current embodiment may have a quadrangular shape with rounded corners. When the second part JT2_1 has a quadrangular shape with rounded corners, the side shape of the second part JT2_1 may include an upper surface and a lower substantially facing the upper surface. Here, a length of the upper surface may be greater than a length or perimeter of the lower surface.

That is, the side shape of the second part JT2_1 may be gradually reduced in width in the first direction DR1 from top to bottom.

As described above, when support bars JT of the second support part slide, rotational texture may be degraded at one end and the other end overlapping an upper part and a lower part of a second housing 320 due to interference by the upper part and the lower part of the second housing 320. That is, when the support bars JT of the second support part slide, there is a possibility that the one end and the other end of each support bar JT will have frictional resistance in an area overlapping the upper part and the lower part of the second housing 320 and that the radius of rotation will be increased.

In addition, if a distance between the support bars JT is increased to prevent this, a pattern due to the distance between the support bars JT is likely to be seen from the outside.

In a display device according to the current embodiment, one support bar JT is reduced in size in an area overlapping the second housing 320, thereby preventing degradation of rotational texture in advance.

More specifically, a planar size of the second part JT2_1 connected to a first part JT1 may be smaller than a planar size of the first part JT1.

The second part JT2_1 may be provided in plural numbers. Although two second parts JT2_1 connected to one first part JT1 are illustrated in FIGS. 8 and 9, the present disclosure is not limited thereto, and the number of the second parts JT2_1 may also be three or more. The second parts JT2_1 may be spaced apart from each other along the first direction DR1. As described above, the second parts JT2_1 spaced apart from each other may be connected to the first part JT1.

Since the side shape of each second part JT2_1 according to the current embodiment has a quadrangular shape with rounded corners, when the support bars JT of the second support part slide, it is possible to reduce frictional resistance of one end and the other end of each support bar JT in an area overlapping the upper part and the lower part of the second housing 320 and also possible to prevent a reduction in the radius of rotation in advance.

In addition, although not illustrated, a display module 100 may be disposed on and under the second parts JT2_1 as described above. Thus, when the display device slides, the display module 100 disposed on and under the second parts JT2_1 can be prevented from being physically damaged.

In addition, a side area of each second part JT2_1 may be smaller than a side area of the first part JT1.

Figure 10:
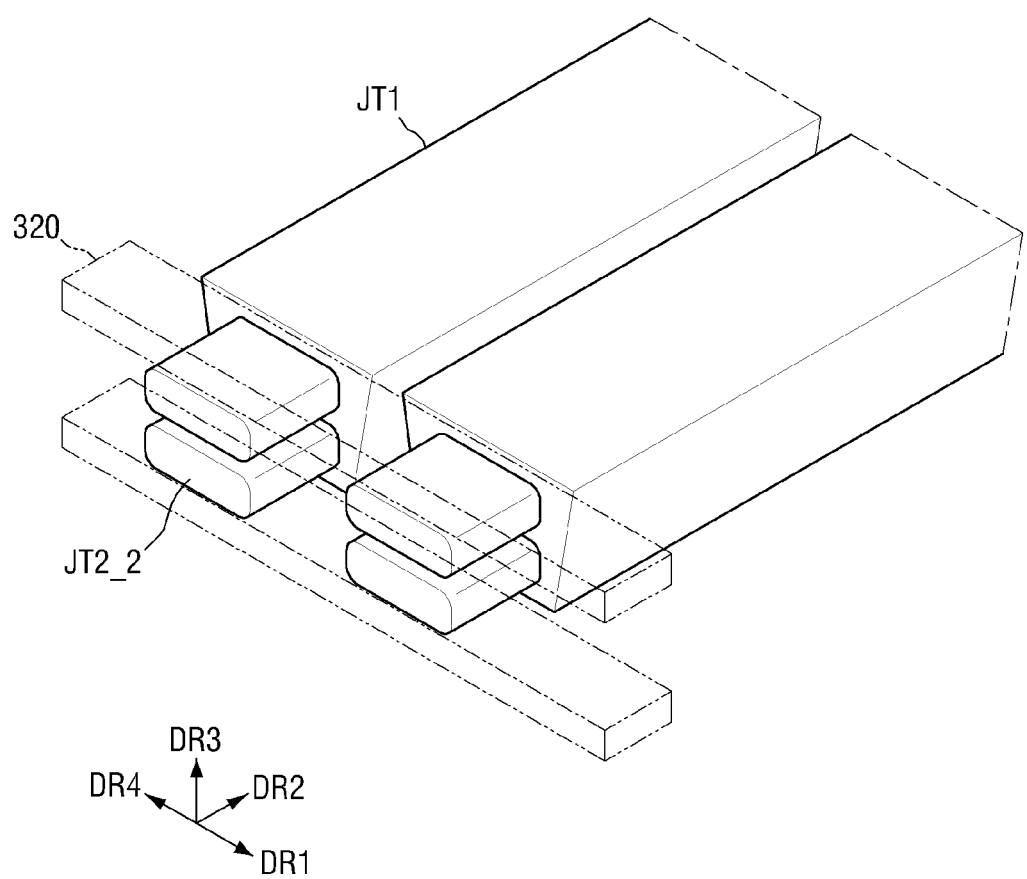
FIG. 10 is a perspective view illustrating the arrangement relationship of joints of a second support part and a second housing according to another embodiment.
Figure 11:
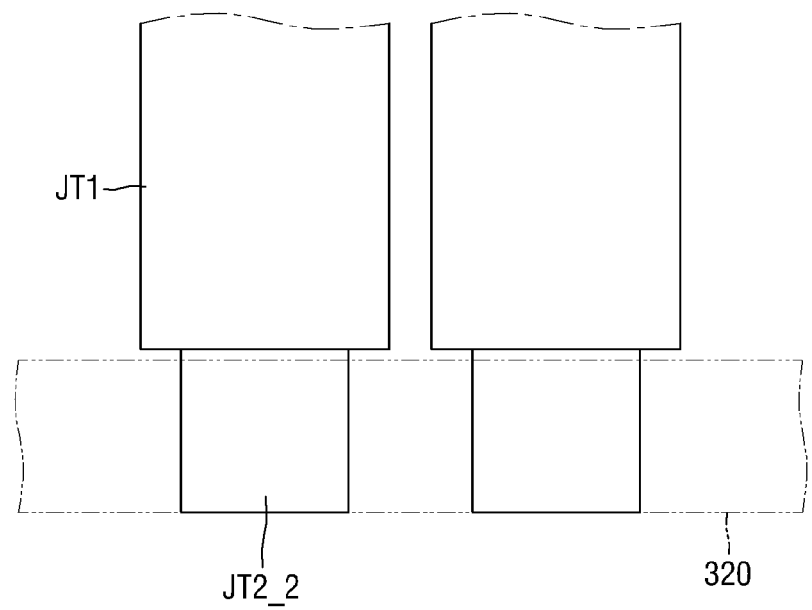
FIG. 11 is a plan view illustrating the arrangement relationship of the joints of the second support part and the second housing according to another embodiment.
Figure 12:
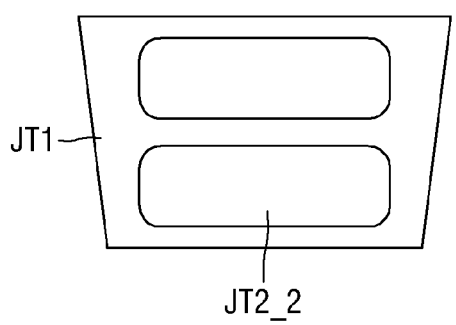
FIG. 12 is a side view illustrating the arrangement relationship of the joints of the second support part and the second housing according to another embodiment.

FIG. 10 is a perspective view illustrating the arrangement relationship of joints of a second support part and a second housing according to another embodiment. FIG. 11 is a plan view illustrating the arrangement relationship of the joints of the second support part and the second housing according to another embodiment. FIG. 12 is a side view illustrating the arrangement relationship of the joints of the second support part and the second housing according to another embodiment.

Referring to FIGS. 10 through 12, the current embodiment is different from that of FIGS. 5 and 7 in that a second part JT2_2 according to the current embodiment has a different shape from a second part JT2 illustrated in FIGS. 5 and 7.

More specifically, a side shape of the second part JT2_2 according to the current embodiment may have a quadrangular shape with rounded corners. When the second part JT2_2 has a quadrangular shape with rounded corners, the side shape of the second part JT2_2 may include an upper surface and a lower substantially facing the upper surface. Here, a length of the upper surface may be the same a length of the lower surface.

In addition, the side shape of the second part JT2_2 may have a smaller width in the thickness direction of the display module 100 than in the first direction DR1. That is, a direction in which the side shape of the second part JT2_2 extends may be the first direction DR1.

As described above, when support bars JT of the second support part slide, rotational texture may be degraded at a first end and a second end overlapping an upper part and a lower part of a second housing 320 due to interference by the upper part and the lower part of the second housing 320. That is, when the support bars JT of the second support part slide, there is a possibility that the first end and the second end of each support bar JT will have frictional resistance in an area overlapping the upper part and the lower part of the second housing 320 and that the radius of rotation will be increased.

In addition, if a distance between the support bars JT is increased to prevent this, a pattern due to the distance between the support bars JT is likely to be seen from the outside.

In a display device according to the current embodiment, one support bar JT is reduced in size in an area overlapping the second housing 320, thereby preventing degradation of rotational texture in advance.

More specifically, a planar size of the second part JT2_2 connected to a first part JT1 may be smaller than a planar size of the first part JT1.

The second part JT2_2 may be provided in plural numbers. Although two second parts JT2_2 connected to one first part JT1 are illustrated in FIGS. 8 and 9, the present disclosure is not limited thereto, and the number of the second parts JT2_2 may also be three or more. The second parts JT2_2 may be spaced apart from each other along the thickness direction of the display module 100. As described above, the second parts JT2_2 spaced apart from each other may be connected to the first part JT1.

Since the side shape of each second part JT2_2 according to the current embodiment has a quadrangular shape with rounded corners, when the support bars JT of the second support part slide, it is possible to reduce frictional resistance of one end and the other end of each support bar JT in an area overlapping the upper part and the lower part of the second housing 320 and also possible to prevent a reduction in the radius of rotation in advance.

In addition, although not illustrated, a display module 100 may be disposed on and under the second parts JT2_2 as described above. Thus, when the display device slides, the display module 100 disposed on and under the second parts JT2_2 can be prevented from being physically damaged.

In addition, a side area of each second part JT2_2 may be smaller than a side area of the first part JT1.

In FIGS. 10 through 12, the second parts JT2_2 have the same planar shape and side shape. However, the present disclosure is not limited thereto, and the second parts JT2_2 may also have different planar shapes and side shapes.

Figure 13:
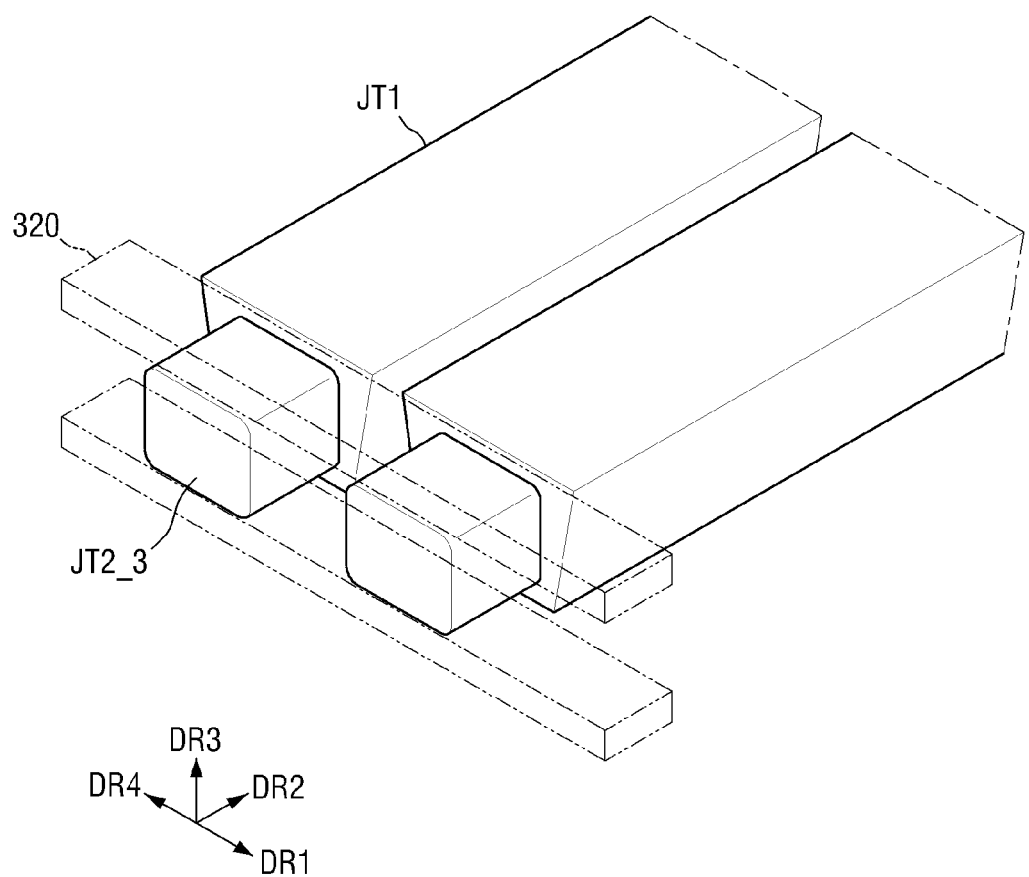
FIG. 13 is a perspective view illustrating the arrangement relationship of joints of a second support part and a second housing according to another embodiment.
Figure 14:
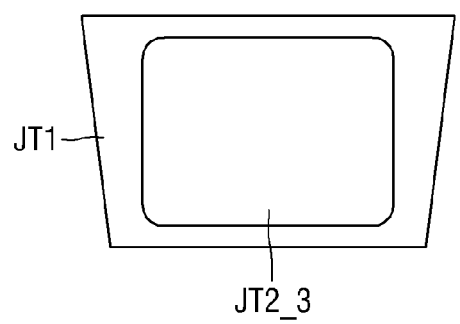
FIG. 14 is a side view illustrating the arrangement relationship of the joints of the second support part and the second housing according to another embodiment.

FIG. 13 is a perspective view illustrating the arrangement relationship of joints of a second support part and a second housing according to another embodiment. FIG. 14 is a side view illustrating the arrangement relationship of the joints of the second support part and the second housing according to another embodiment.

Referring to FIGS. 13 and 14, the current embodiment is different from that of FIGS. 5 and 7 in that only one second part JT2_3 is formed unlike the second parts JT2 illustrated in FIGS. 5 and 7.

More specifically, a side shape of the second part JT2_3 according to the current embodiment may have a quadrangular shape with rounded corners. For example, the side shape of the second part JT2_3 may have a square shape with rounded corners. When the second part JT2_3 has a quadrangular shape with rounded corners, the side shape of the second part JT2_3 may include an upper surface and a lower substantially facing the upper surface. Here, a length of the upper surface may be the same as a length of the lower surface.

In addition, a width of the side shape of the second part JT2_3 in the thickness direction of the display module 100 may be substantially the same as a width thereof in the first direction DR1.

As described above, when support bars JT of the second support part slide, rotational texture may be degraded at one end and the other end overlapping an upper part and a lower part of a second housing 320 due to interference by the upper part and the lower part of the second housing 320. That is, when the support bars JT of the second support part slide, there is a possibility that the one end and the other end of each support bar JT will have frictional resistance in an area overlapping the upper part and the lower part of the second housing 320 and that the radius of rotation will be increased.

In addition, if a distance between the support bars JT is increased to prevent this, a pattern due to the distance between the support bars JT is likely to be seen from the outside.

In a display device according to the current embodiment, one support bar JT is reduced in size in an area overlapping the second housing 320, thereby preventing degradation of rotational texture in advance.

More specifically, a planar size of the second part JT2_3 connected to a first part JT1 may be smaller than a planar size of the first part JT1.

Only one second part JT2_3 may be provided.

Since the side shape of the second part JT2_3 according to the current embodiment has a quadrangular shape with rounded corners, when the support bars JT of the second support part slide, it is possible to reduce frictional resistance of one end and the other end of each support bar JT in an area overlapping the upper part and the lower part of the second housing 320 and also possible to prevent a reduction in the radius of rotation in advance.

In addition, although not illustrated, a display module 100 may be disposed on and under the second part JT2_3 as described above. Thus, when the display device slides, the display module 100 disposed on and under the second part JT2_3 can be prevented from being physically damaged.

In addition, a side area of each second part JT2_3 may be smaller than a side area of the first part JT1.

Figure 15:
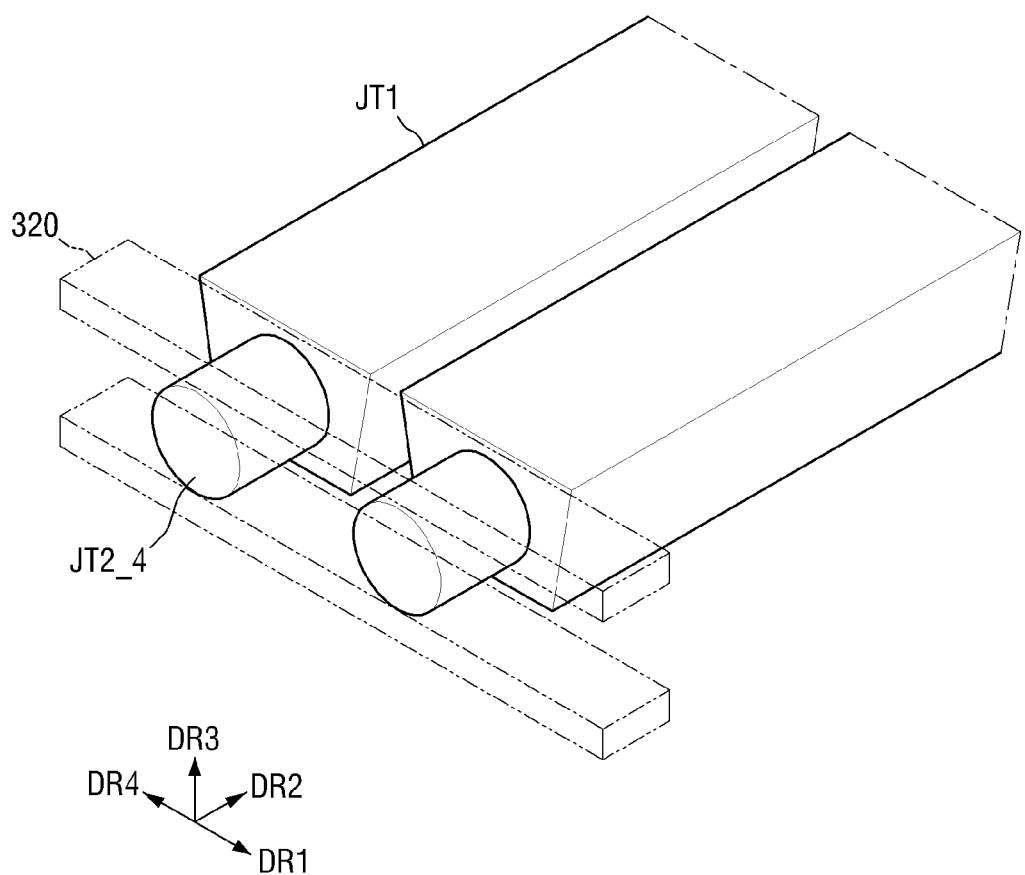
FIG. 15 is a perspective view illustrating the arrangement relationship of joints of a second support part and a second housing according to another embodiment.
Figure 16:
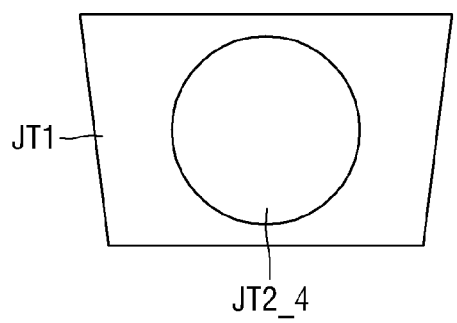
FIG. 16 is a side view illustrating the arrangement relationship of the joints of the second support part and the second housing according to another embodiment.

FIG. 15 is a perspective view illustrating the arrangement relationship of joints of a second support part and a second housing according to another embodiment. FIG. 16 is a side view illustrating the arrangement relationship of the joints of the second support part and the second housing according to another embodiment.

Referring to FIGS. 15 and 16, the current embodiment is different from that of FIGS. 5 and 7 in that only one second part JT2_4 is formed unlike the second parts JT2 illustrated in FIGS. 5 and 7.

More specifically, a side shape of the second part JT2_4 according to the current embodiment may have a circular shape. For example, the side shape of the second part JT2_4 may have a circular shape with a constant curvature. However, the present disclosure is not limited thereto, and the side shape of the second part JT2_4 may also have an oval shape with a varying curvature.

As described above, when support bars JT of the second support part slide, rotational texture a user feels may be degraded at one end and the other end overlapping an upper part and a lower part of a second housing 320 due to interference by the upper part and the lower part of the second housing 320. That is, when the support bars JT of the second support part slide, there is a possibility that the one end and the other end of each support bar JT will have frictional resistance in an area overlapping the upper part and the lower part of the second housing 320 and that the radius of rotation will be increased.

In addition, if a distance between the support bars JT is increased to prevent this, a pattern due to the distance between the support bars JT is likely to be seen from the outside.

In a display device according to the current embodiment, one support bar JT is reduced in size in an area overlapping the second housing 320, thereby preventing degradation of rotational texture in advance.

More specifically, a planar size of the second part JT2_4 connected to a first part JT1 may be smaller than a planar size of the first part JT1.

Only one second part JT2_4 may be provided.

Since the side shape of the second part JT2_4 according to the current embodiment has a circular shape, when the support bars JT of the second support part slide, it is possible to reduce frictional resistance of one end and the other end of each support bar JT in an area overlapping the upper part and the lower part of the second housing 320 and also possible to prevent a reduction in the radius of rotation in advance.

In addition, although not illustrated, a display module 100 may be disposed on and under the second part JT2_4 as described above. Thus, when the display device slides, the display module 100 disposed on and under the second part JT2_4 can be prevented from being physically damaged.

In addition, a side area of each second part JT2_4 may be smaller than a side area of the first part JT1.

Figure 17:
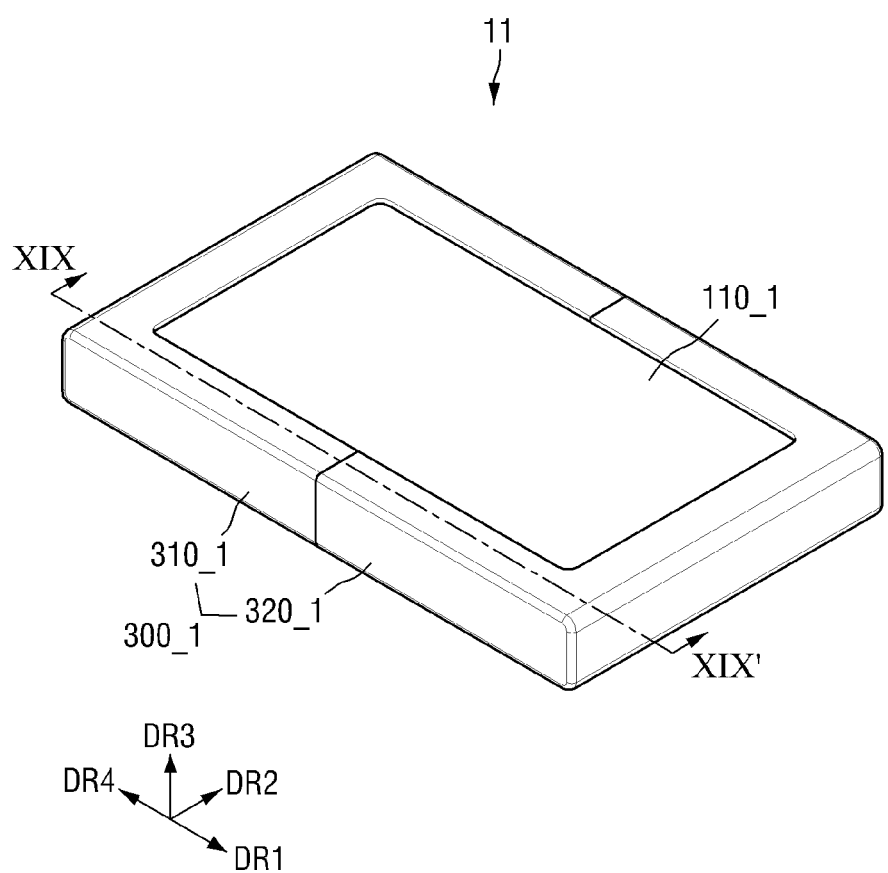
FIG. 17 is a perspective view of a display device according to another embodiment before a sliding operation.
Figure 18:
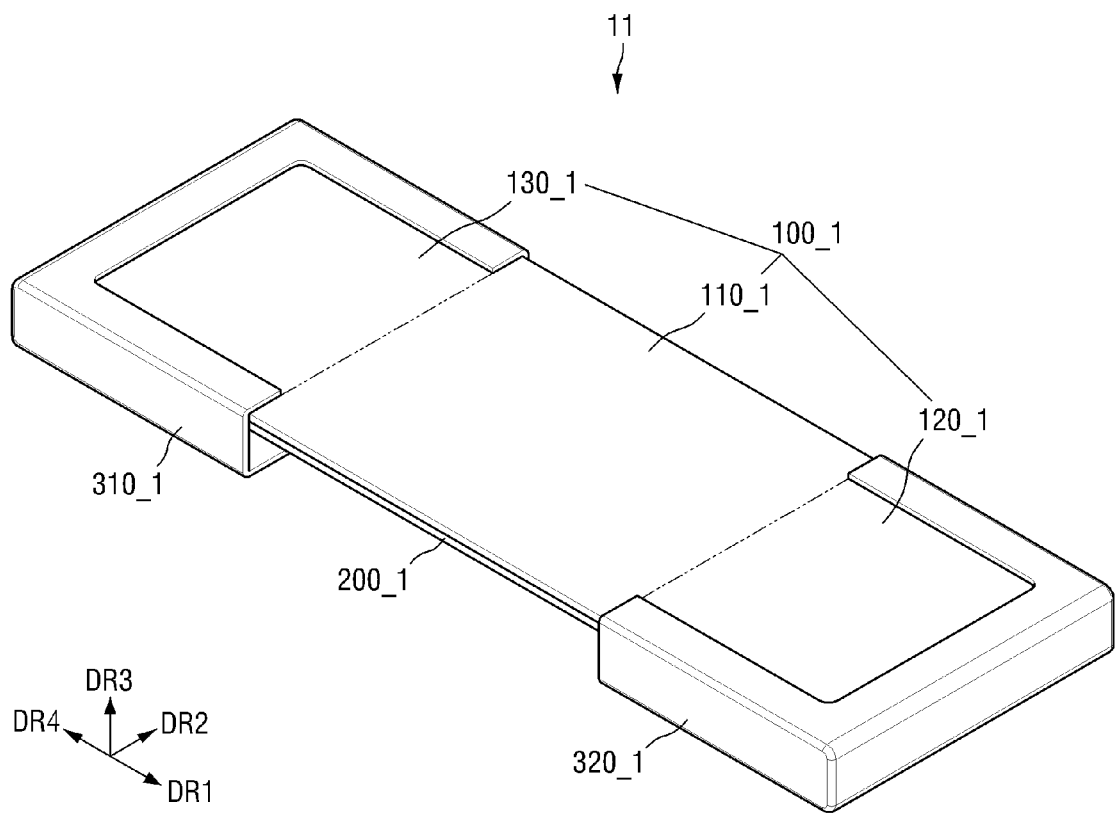
FIG. 18 is a perspective view of the display device according to another embodiment after a sliding operation.
Figure 19:
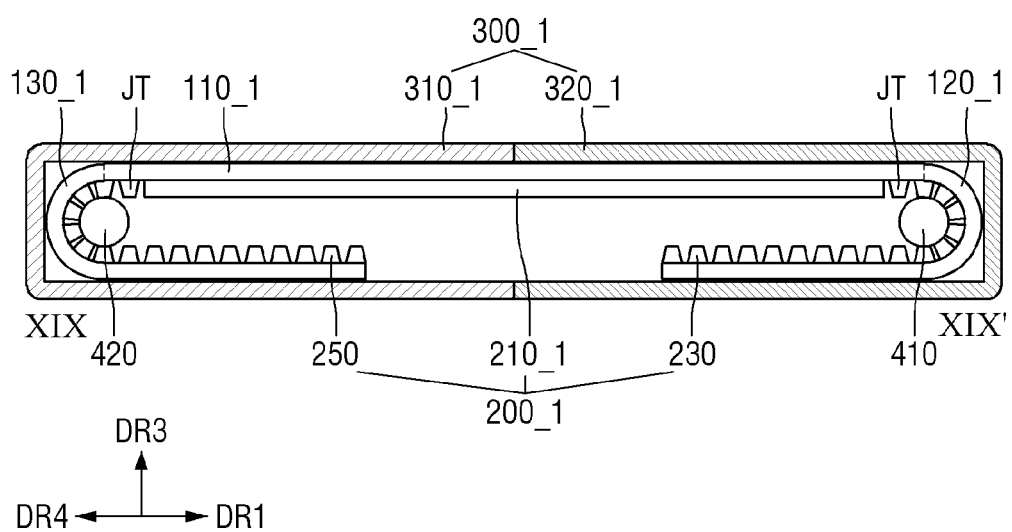
FIG. 19 is a schematic cross-sectional view of FIG. 17.
Figure 20:
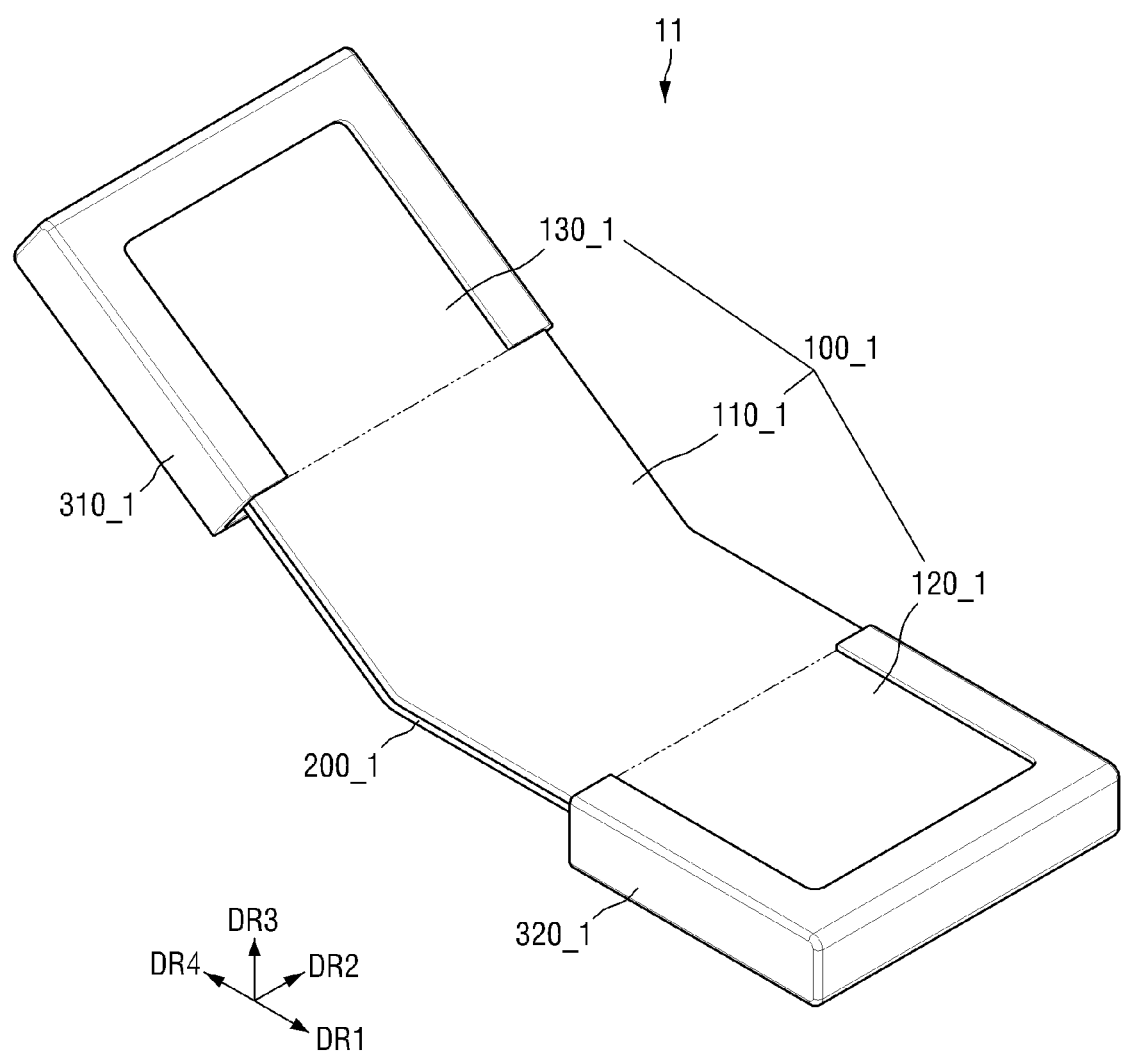
FIG. 20 is a perspective view illustrating a folding operation of the display device according to another embodiment.

FIG. 17 is a perspective view of a display device according to another embodiment before a sliding operation. FIG. 18 is a perspective view of the display device according to another embodiment after a sliding operation. FIG. 19 is a schematic cross-sectional view of FIG. 17. FIG. 20 is a perspective view illustrating a folding operation of the display device according to another embodiment.

Referring to FIGS. 17 through 20 the display device 11 according to the current embodiment is different from the display device 10 according to the previous embodiment in that it is a double-slidable display device.

More specifically, as illustrated in FIGS. 17 and 18, the display device 10 may include a display module 100_1, a support member 200_1 and housings 3001 (310_1 and 320_1) and may further include a second guide member 420. The display module 100_1 may include further include a first display unit 110_1, a second display unit 120_1, and a third display unit 130_1. The third display unit 130_1 may be spaced apart from the second display unit 120_1 with the first display unit 110_1 interposed therebetween.

The display module 100_1 may be a flexible display module. That is, the flexible display module can be folded or oiled. The display module 100_1 according to the current embodiment is a module or panel that displays an image in response to an input data signal, and a panel such as an organic light emitting display panel, a liquid crystal display panel, a plasma display panel, or an electrophoretic display panel may be applied. In the illustrated embodiment, an organic light emitting display panel is applied as a display module or a display panel.

The display module 100_1 includes a plurality of pixels. Each pixel may include a light emitting layer and a circuit layer for controlling the amount of light emitted from the light emitting layer. The circuit layer may include a display line, a display electrode, and at least one transistor. The light emitting layer may include an organic light emitting material. The light emitting layer may be sealed by an encapsulation layer. The encapsulation layer may seal the light emitting layer to prevent moisture, etc. from being introduced from the outside. The encapsulation layer may be a single or multi-layered inorganic layer or may be a stacked layer in which an inorganic layer and an organic layer are alternately stacked.

The first through third display units 110_1 through 1301 of the display module 100_1 may include a plurality of pixels. The display module 100_1 may further include a non-display unit disposed around the first through third display units 330_1 through 130_1. The non-display unit may be an area overlapped by the housings 300_1 and not visible from the outside due to the housings 300_1. The pixels may not be disposed in the non-display unit. However, the present disclosure is not limited thereto, and the pixels may also be disposed in a part of the non-display unit in another embodiment.

The display module 100_1 may further include a touch member. The touch member may be directly disposed on the encapsulation layer or may be attached to the encapsulation layer through a bonding layer or the like in the form of a touch panel. The touch member may include a plurality of touch electrodes disposed on one layer or a plurality of layers. However, the elements included in the display module 100_1 are not limited thereto.

The support member 200_1 may overlap the display module 100_1. The support member 200_1 may overlap the first through third display units 110_1 through 130_1 of the display module 100_1 in the thickness direction of the display module 100_1.

As will be described later, the support member 200_1 may include a first support part 210_1 overlapping the first display unit 110_1, a second support part 230 overlapping the second display unit 120_1, and a third support part 250 overlapping the third display unit 130_1. The first support part 210_1 and the first display unit 110_1 may directly contact each other, the second support part 230 and the second display unit 120_1 may directly contact each other, and the third support part 250 and the third display unit 130_1 may directly contact each other.

The housings 300_1 may include a first housing 310_1 and a second housing 320_1.

The display device 11 in a first operating mode will be described with reference to FIG. 17. The first housing 310_1 and the second housing 320_1 are coupled to each other. The first housing 310_1 and the second housing 320_1 may physically directly contact each other in the first operating mode.

The first display unit 110_1 may be exposed to the outside to provide image information to a user both in the first and second operating modes. The second display unit 120_1 may be accommodated in the second housing 320_1, and the third display unit 130_1 may be accommodated in the first housing 310_1 in the first operating mode. Since the second display unit 1201 and the third display unit 130_1 are accommodated in the second housing 320_1 and the first housing 310_1, respectively, in the first operating mode, even if the second display unit 120_1 and the third display unit 130_1 include a plurality of pixels, an image displayed on the second display unit 120_1 and the third display unit 130_1 may not be visible from the outside. That is, the second display unit 120_1 and the third display unit 130_1 may not provide image information to a user in the first operating mode. However, the present disclosure is not limited thereto, and the second display unit 120_1 and the third display unit 130_1 may also provide image information to a user in the first operating mode in another embodiment.

The support member 2001 may have substantially the same planar size as the display module 100_1. Like the display module 100_1, the support member 200_1 may be accommodated in the first housing 310_1 and the second housing 320_1 in the first operating mode. In FIG. 17, accommodating groove or a guide groove GG defined in insides of sidewalls of the housings 310_1 and 320_1 extending along the first direction DR1 and in which the support member 200_1 and the display module 100_1 are accommodated or mounted is not shown. However, the housings 310_1 and 320_1 may further define an accommodating groove or a guide groove GG in which the support member 200_1 and edge parts of the display module 100_1 are accommodated or mounted (refer to FIG. 5).

The display device 11 in a second operating mode will be described with reference to FIG. 18. The first housing 310_1 and the second housing 320_1 are separated from each other. As the first housing 310 is moved along the fourth direction DR4 and the second housing 320_1 is moved toward the first direction DR1, the first housing 310_1 and the second housing 320_1 may be physically separated from each other. The second display unit 120_1 may be exposed to the outside from the second housing 320_1 moving along the first direction DR1, and the third display unit 130_1 may be exposed to the outside from the first housing 310_1 moving along the fourth direction DR4. The second display unit 120_1 and the third display unit 130_1 may include a plurality of pixels as described above. Therefore, as the second housing 320_1 is moved along the first direction DR1 and the first housing 310_1 is moved along the fourth direction DR4, the second display unit 120_1 and the third display unit 130_1 may provide image information to a user in the second operating mode of the display device 11.

The first display unit 110_1 is exposed to the outside in the first operating mode, and the second display unit 120_1 and the third display unit 130_1 are accommodated in the second housing 320_1 and the first housing 3101, respectively, in the first operating mode and exposed to the outside from the second housing 320_1 and the first housing 310_1, respectively, in the second operating mode.

Referring to FIG. 19, the first support part 210_1 may substantially overlap the first display unit 110_1 of the display module 100_1, the second support part 230 may substantially overlap the second display unit 120_1 of the display module 100_1, and the third support part 250 may substantially overlap the third display unit 130_1 of the display module 100_1. That is, the first support part 210_1 may be disposed under the first display unit 110_1, the second support part 230 may be disposed under the second display unit 120_1, and the third support part 250 may be disposed under the third display unit 130_1.

As illustrated in FIG. 19, the first housing 310_1 may include a sidewall located in the fourth direction DR4 (i.e., left side in FIG. 4) and extending along the second direction DR2, an upper part extending along the first direction DR1 from an upper end of the sidewall located in the fourth direction DR4, and a lower part extending along the first direction DR1 from a lower end of the sidewall located in the fourth direction DR4.

Like the first housing 310_1, the second housing 320_1 may include a sidewall located in the first direction DR1 (i.e., right side in FIG. 4) and extending along the second direction DR2, an upper part extending along the fourth direction DR1 from an upper end of the sidewall located in the first direction DR1, and a lower part extending along the fourth direction DR4 from a lower end of the sidewall located in the first direction DR1.

The upper part and the lower part of the second housing 320_1 may be in contact with and coupled to the upper part and the lower part of the first housing 310_1, respectively.

A first guide member 410 has been described above with reference to FIGS. 1 through 3, and thus a redundant description thereof will be omitted.

The second guide member 420 may be physically connected to the first housing 310_1. The second guide member 420 may be a rotor that enables the display module 100_1 and the support member 200_1 to rotate along the second guide member 420 in the second operating mode. The second guide member 420 may be a rotor extending along the second direction DR2.

In the first operating mode, each of the display module 100_1 and the support member 200_1 may be rolled along the first guide member 410 and the second guide member 420. That is, in the first operating mode, the first display unit 110 of the display module 100_1 may be flat, and the third display unit 130_1 of the display module 100_1 may be rolled along the second guide member 420 to lie on the sidewall of the first housing 310_1 and also face the first display unit 110_1. That is, the second guide member 420 may bend the third display unit 130_1 inserted into the first housing 310_1 so that the third display unit 130_1 faces the first display unit 110.

Although not illustrated in the drawings, the second guide member 420 may roll the third display unit 130_1 inserted into the first housing 310_1 so that the third display unit 130_1 is wound around the second guide member 420.

The first support part 210_1 of the support member 200_1 may have a generally flat shape to face the first display unit 110_1, and the third support part 250, like the third display unit 130_1 of the display module 100_1, may be rolled along the second guide member 420 to lie on the sidewall of the first housing 310_1 and also face the third support part 250.

The first support part 210_1 may not have completely the same planar size as the first display unit 110_1 of the display module 100_1 in a plan view and thus may be disposed on a part of the first display unit 110_1 but may not be disposed on another part. The third support part 250 may be disposed on a part of the first display unit 110_1 on which the first support part 210_1 is not disposed and on a surface of the third display unit 130_1.

Like the second support part 230, the third support part 250 may include a support bar JT. The support bar JT of the third support part 250 may extend along the second direction DR2. The third support part 250 may include a plurality of support bars JT. The support bars JT may be spaced apart from each other. That is, the support bars JT may be spaced apart from each other along the first direction DR1.

The planar shape and side shape of the support bars JT and first and second parts JT1 and JT2 of the support bars JT are the same as those described above with reference to FIGS. 5 through 7, and thus a redundant description thereof will be omitted.

Referring to FIG. 20, the display device 11 according to the current embodiment may be a foldable display device that is folded about a predetermined area (an area extending along the second direction DR2) of the first display unit 110_1. More specifically, the display device 11 according to the current embodiment may be an in-folding display device that is in-folded about a predetermined area (an area extending along the second direction DR2) of the first display unit 110_1.

Although not illustrated, a display surface of the first display unit 110_1 may be divided into a first part and a second part in a plan view by a hinge disposed on the first support part. The display device 11 may be in-folded so that the first part and the second part face each other. Such folding may further increase portability of the display device 11. In addition, when the display device 11 can be in-folded, the display surface can be protected from external impacts or contaminants, which, in turn, helps improve durability. The hinge disposed on the first support part may enable rotation about a direction axis parallel to the second direction DR2.

Figure 21:
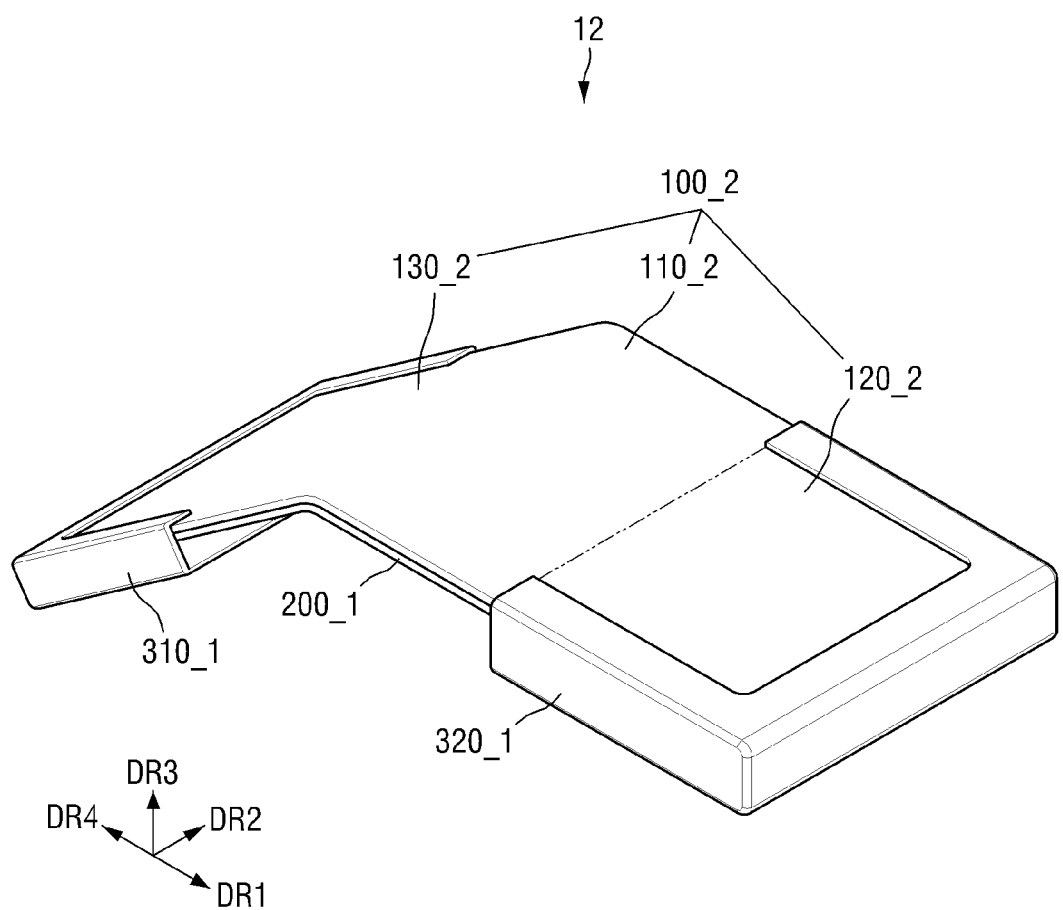
FIG. 21 is a perspective view illustrating a folding operation of a display device according to another embodiment.

FIG. 21 is a perspective view illustrating a folding operation of a display device according to another embodiment.

Referring to FIG. 21, the display device 12 according to the current embodiment is different from the display device 11 according to FIGS. 17 through 19 in that it is a foldable display device that can be out-folded.

More specifically, a display surface of a first display unit 110_1 may be divided into a first part and a second part in a plan view by the hinge. The display device 12 may be out-folded so that the first part and the second part face outward. Such folding may further increase portability of the display device 12. In addition, when the display device 12 can be out-folded, more various forms of image information can be provided to a user.

Although the embodiments of the present disclosure have been disclosed for illustrative purposes, the embodiments are only exemplified, but do not limit the present disclosure. Those skilled in the art will appreciate that various modifications and applications are possible, without departing from the scope and spirit of the disclosure as disclosed in the accompanying claims. For example, each element specified in embodiments of the present disclosure can be variously modified and implemented. Further, differences related to such modifications and applications should be interpreted as being included in the scope of the present disclosure defined by the accompanying claims.

The invention claimed is:

1. A display device comprising:
a display module which comprises a first display unit and a second display unit;
a support member which comprises a first support part disposed under the first display unit and a second support part disposed under the second display unit;
a first housing which accommodates the first support part and the first display unit;
a second housing which accommodates the second support part and the second display unit and into or from which the second support part and the second display unit are inserted or withdrawn; and
a guide groove which is defined inside the second housing and guides the second support part during the inserting or withdrawing,
wherein the inserting or withdrawing is performed along a first direction,
the second support part comprises a plurality of support bars which extend along a second direction intersecting the first direction and are spaced apart from each other along the first direction, and
each of the support bars comprises a first part which is not inserted into the guide groove and a second part which is inserted into the guide groove,
wherein a width of the second part in the first direction is smaller than a width of the first part in the first direction.

2. The display device of claim 1, wherein the second part is provided in plural, and at least two second parts among the plurality of second parts are connected to one end of the first part.

3. The display device of claim 2, wherein the at least two second parts are spaced apart from each other along the first direction.

4. The display device of claim 2, wherein the at least two second parts are spaced apart from each other along a thickness direction of the display module.

5. The display device of claim 1, wherein the first support part is monolithic.

6. The display device of claim 1, wherein a side area of the second part is smaller than a side area of the first part.

7. The display device of claim 6, wherein a perimeter of an upper surface is greater than a perimeter of a lower surface in a side shape of the first part, and a perimeter of an upper surface is greater than a perimeter of a lower surface in a side shape of the second part.

8. The display device of claim 1, wherein the second housing is inserted in the first housing in a first operating mode, and the second housing is withdrawn from the first housing in a second operating mode.

9. The display device of claim 8, wherein the first display unit is exposed to an outside both in the first operating mode and the second operating mode, and the second display unit is accommodated in the second housing in the first operating mode and is exposed to the outside from the second housing in the second operating mode.

10. The display device of claim 9, further comprising a guide member which is coupled to the second housing and guides the second support part during the inserting or withdrawing, wherein the guide member bends the second display unit inserted into the second housing so that the second display unit faces the first display unit.

11. The display device of claim 10, wherein the guide member rolls the second display unit inserted into the second housing so that the second display unit is wound around the guide member.

12. The display device of claim 1, wherein the second housing is disposed between the first housing and the display module and coupled to the first housing.

13. The display device of claim 12, wherein the second housing comprises a first part disposed between the first housing and the display module and a second part protruding further than the first part in a thickness direction of the display module, and the second part is disposed on a side surface of the first housing.

14. The display device of claim 10, wherein the guide member is a rotor.

15. A display device comprising:
a display module which comprises a first display unit, a second display unit, and a third display unit;
a support member which comprises a first support part disposed under the first display unit, a second support part disposed under the second display unit, and a third support part disposed under the third display unit;
a first housing into or from which the second support part and the second display unit are inserted or withdrawn;
a second housing into or from which the third support part and the third display unit are inserted or withdrawn;
a first guide member which is coupled to the first housing and guides the second support part during the inserting or withdrawing; and
a second guide member which is coupled to the second housing and guides the third support part during the inserting or withdrawing,
wherein the inserting or withdrawing of the second support part and the third support part is performed along a first direction,
the second support part comprises a plurality of support bars which extend along a second direction intersecting the first direction and are spaced apart from each other, and
each of the support bars comprises a first part which does not overlap an upper part of the first housing and a second part which overlaps the upper part of the first housing,
wherein a width of the second part in the first direction is smaller than a width of the first part in the first direction.

16. The display device of claim 15, wherein the third support part comprises a plurality of support bars which extend along the second direction and are spaced apart from each other, and
each of the support bars of the third support part comprises a third part which does not overlap an upper part of the second housing and a fourth part which overlaps the upper part of the second housing,
wherein a width of the fourth part in the first direction is smaller than a width of the third part in the first direction.

17. The display device of claim 15, wherein the second part is provided in plural, and at least two second parts among the plurality of second parts are connected to one end of the first part.

18. The display device of claim 17, wherein the at least two second parts are spaced apart from each other along the first direction.

19. The display device of claim 17, wherein the at least two second parts are spaced apart from each other along a thickness direction of the display module.

20. The display device of claim 15, wherein a side area of the second part is smaller than a side area of the first part.

* * * * *